United States Patent [19]

Schulte

[11] 4,228,902
[45] Oct. 21, 1980

[54] CARRIER FOR SEMICONDUCTIVE WAFERS

[75] Inventor: Harvey L. Schulte, Los Altos, Calif.

[73] Assignee: Kasper Instruments, Inc., Sunnyvale, Calif.

[21] Appl. No.: 13,368

[22] Filed: Feb. 21, 1979

Related U.S. Application Data

[63] Continuation of Ser. No. 848,921, Nov. 7, 1977, abandoned.

[51] Int. Cl.$^2$ .................... B23P 17/00; A47G 19/02
[52] U.S. Cl. ............................. 211/41; 118/500; 206/454; 294/87 R; 432/258
[58] Field of Search .................. 211/41, 4; 118/500; 206/454, 455; 432/258, 259; 294/87 R

[56] References Cited

U.S. PATENT DOCUMENTS

| | | | |
|---|---|---|---|
| 3,877,134 | 4/1975 | Shanahan | 211/41 X |
| 3,926,305 | 12/1975 | Wallestad | 206/454 X |
| 4,053,294 | 10/1977 | Sullivan | 432/259 X |
| 4,153,164 | 5/1979 | Hofmeister et al. | 211/41 |

Primary Examiner—Roy D. Frazier
Assistant Examiner—Robert W. Gibson, Jr.
Attorney, Agent, or Firm—Roland I. Griffin

[57] ABSTRACT

A carrier having a plurality of transport channels arranged in stacked parallel relationship for receiving semiconductive wafers is provided with a pair of oppositely facing recessed regions extending partially into the transport channels. In each of these recessed regions a stop member is pivotally mounted and spring-loaded for automatic movement between an inoperative position out of the transport channels to permit passage of the semiconductive wafers therethrough, when the carrier is set down, and an operative position protruding into the transport channels and blocking passage of the semiconductive wafers therethrough to impede spillage of any semiconductive wafers contained in the carrier, when the carrier is picked up.

20 Claims, 6 Drawing Figures

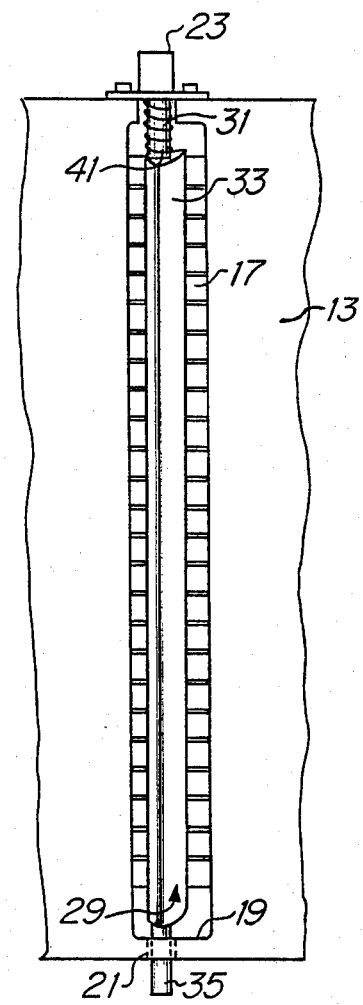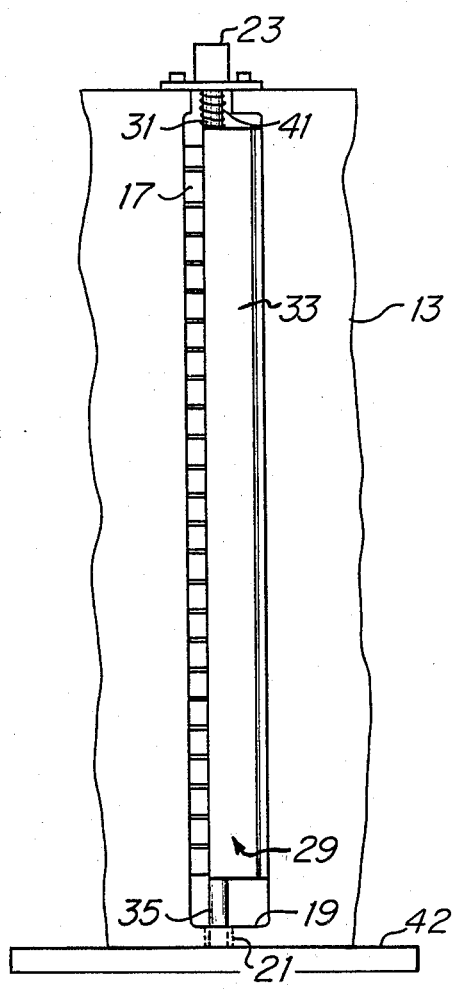
Figure 4
Figure 2

CARRIER FOR SEMICONDUCTIVE WAFERS

This is a continuation of application Ser. No. 848,921, filed Nov. 7, 1977, now abandoned.

BACKGROUND OF THE INVENTION

This invention relates generally to carriers for semiconductive wafers and, more particularly, to such carriers having provision for impeding spillage of semiconductive wafers therefrom during manual handling of the carriers.

Carriers for holding twelve, twenty-four or more spaced semiconductive wafers each are employed in many types of semiconductive wafer processing systems to facilitate batch processing and to minimize damage of the wafers due to improper handling. Such carriers are employed, for example, as input magazines for sequentially supplying semiconductive wafers to automatic wafer handling and processing systems, or as output magazines for sequentially receiving processed semiconductive wafers from such systems, or as intermediate (throughput) devices for holding semiconductive wafers that may require sampling, testing, or some other special handling at some point during processing by such systems. In nearly all of these cases the carriers must, at some point, be manually transported to or from such systems with the attendant risk that in so doing the semiconductive wafers may slip from the carriers and thereby be damaged or broken. This risk is particularly great in the case of carriers of the type permitting unobstructed passage of semiconductive wafers therethrough. If such carriers are tilted slightly forward or backward while they are being manually transported, any semiconductive wafers contained therein will slide out. Although this risk is much less critical in the case of a carrier of the type permitting passage of semiconductive wafers into or out of the carrier from only one end of the carrier, care must still be exercised while such a carrier is being manually transported to avoid tilting it downward in the direction of its open end.

Past efforts to eliminate the risk of spilling semiconductive wafers from carriers while they are being manually transported have resulted in elaborate switching mechanisms for locking the semiconductive wafers in place in the carriers during manual transport thereof. However, the person transporting the carriers has to remember to actuate the switching mechanism before picking up the carriers or run the risk of spilling the semiconductive wafers contained therein, in which event, the risk is, in fact, not reduced at all. Moreover, when placing the carriers in a semiconductive wafer handling and processing system the person transporting the carriers also has to remember to deactuate the switching mechanisms in order to release the semiconductive wafers to the handling and processing system. In addition to these drawbacks, such switching mechanisms are generally complex and add significantly to the cost of the carriers.

SUMMARY OF THE INVENTION

The principal object of this invention is to provide an improved carrier for semiconductive wafers that is automatically operable when picked up to impede spillage of the semiconductive wafers from the carrier and that is automatically operable when set down to release the semiconductive wafers.

Another object of this invention is to provide an improved carrier of the foregoing type that is simple in design and operation and that is not significantly more expensive than a standard carrier.

These objects are accomplished in accordance with the illustrated preferred embodiment of this invention by providing a carrier having a pair of fixedly-spaced oppositely-facing side plates forming a plurality of transport channels arranged in parallel stacked relationship for receiving a like plurality of semiconductive wafers. In each side plate a recessed region is provided extending partially into the transport channels and having a spring-loaded stop member pivotally mounted therein. In response to the carrier being set down, each stop member is activated to automatically permit passage of the wafers through the channels (i.e., to not block the channels), and in response to the carrier being picked-up, stop member is activated to automatically block the channels and prevent wafer spillage by inhibiting passage of the wafers through the channels.

BRIEF DESCRIPTION OF THE DRAWINGS

FIG. 2 is a side view of the carrier of FIG. 1 showing the orientation of one of the stop members when the carrier is set down upon the surface.

FIG. 4 is a side view of the carrier of FIG. 1 showing the orientation of one of the stop members when the carrier is lifted from the surface.

DESCRIPTION OF THE PREFERRED EMBODIMENT

Figure 1:
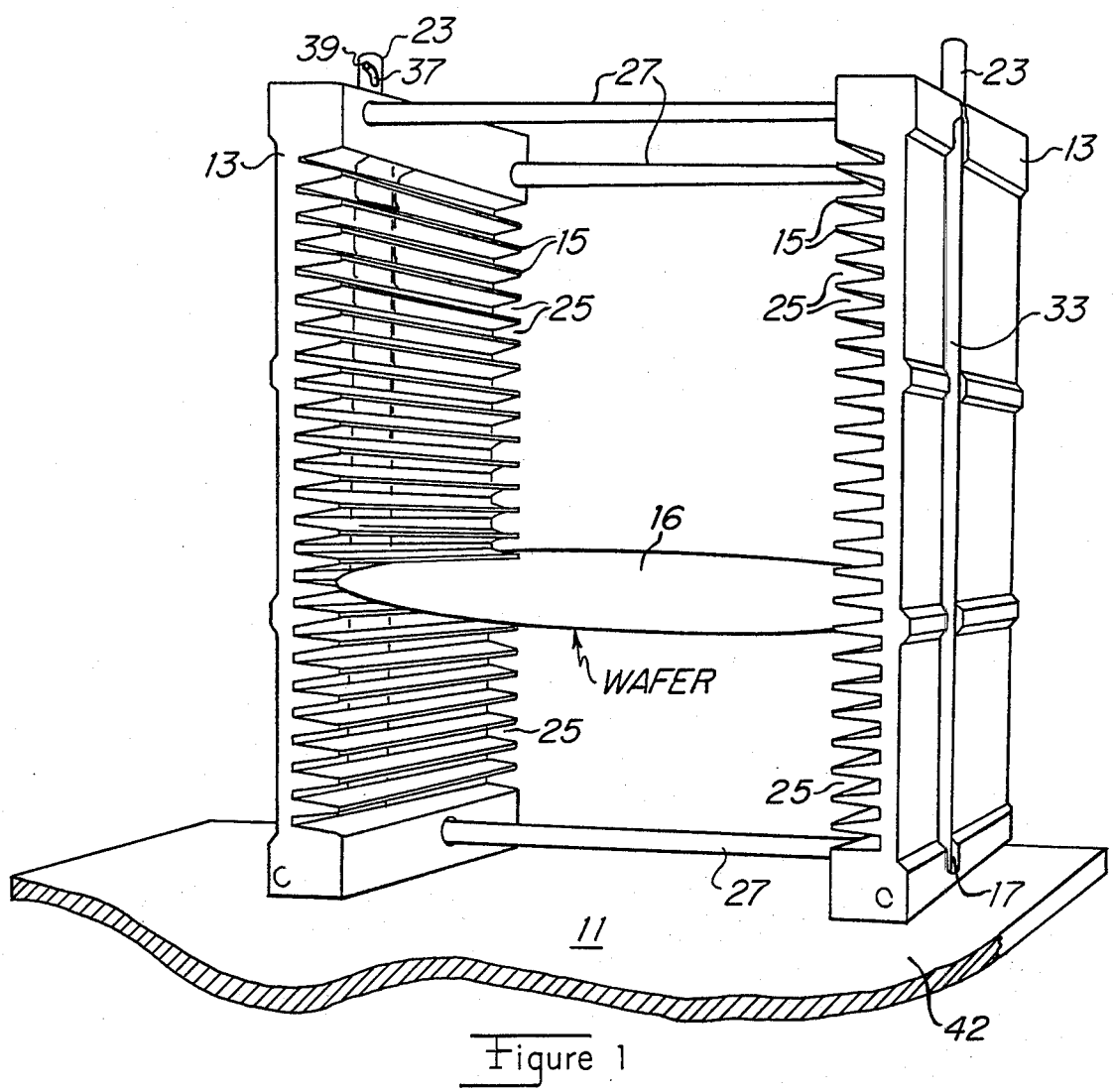
FIG. 1 is a perspective view, of the carrier of the present invention when carrier is set down upon a surface.
Figure 3:
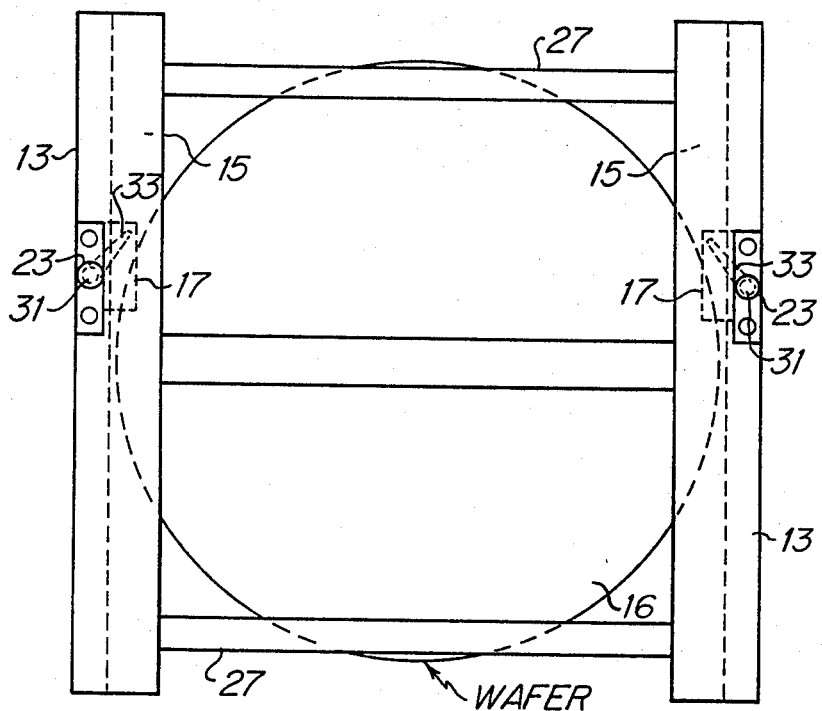
FIG. 3 is a top view of the carrier of FIG. 1 when the carrier is lifted from the surface.

Referring now to FIGS. 1, 2 and 3, there is shown a carrier 11 with two sides 13, each side having a plurality of flanges 15 and having a recessed region 17 with a shaft-support portion 19, the shaft-support portion having an aperture 21 therethrough. The recessed region of each side 13 17 is bounded at one end (the top end) by a cam housing 23, and at the other end (the bottom end) by the shaft-support portion 19. Each cam housing 23 is affixed (for example, by screws) to the top end of corresponding side 13. The sides 13 are spaced apart a selected distance, with the flanges 15 positioned facing each other such that corresponding pairs of consecutive flanges on each side 13 form stacked parallel transport channels 25 into which semiconductive wafers or the like may be placed. Rods 27, which are anchored (e.g., riveted or screwed) to the sides 13, serve to fix the position and distance of the sides 13 with respect to each other. The recessed region 17 of each side 13 extends partially into the flanges 15 and into the transport channels 25 at a selected angle substantially perpendicular to the flanges and the transport channels.

A spring-loaded stop member (flag shaft) 29 is pivotally mounted in each recessed region 17. Each stop member 29 comprises a top shaft portion 31, a middle or flag portion 33, and a bottom shaft portion 35, the top shaft portion 31 being disposed for pivotal and translational movement within the corresponding cam housing 23 and the bottom shaft portion 35 being disposed for translational movement through aperture 21 of the corresponding shaft-support portion 19. A cam slot 37 is provided in each cam housing 23. A cam follower pin 39 is provided at the end of the top shaft portion 31 of each stop member 29 for prescribed movement within the cam slot 37 of the corresponding cam housing 23. Each stop member 28 has a compressible spring 41 disposed about the top shaft portion 31 between the flag portion 33 and the base of the corresponding cam housing 23.

Figure 5:
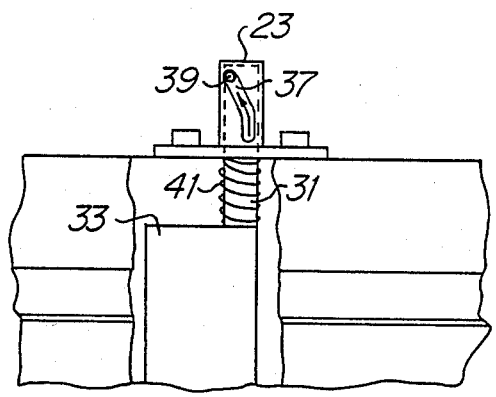
FIGS. 5 and 6 are cutaway views of a portion of the carrier of FIG. 1 showing one of the cam housings, and the position and orientation of one end of the stop member in that cam housing when the carrier is set down upon the surface and when the carrier is lifted from the surface, respectively.
Figure 6:
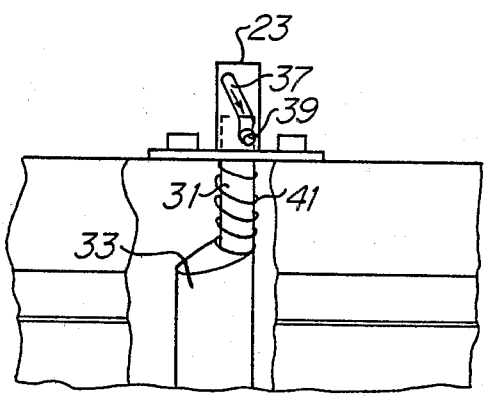

As shown in FIGS. 1, 2, 3 and 4, bottom shaft portions 35 of stop members 29 may be inserted (pushed) fully into apertures 21 or may extend a selected length from the bottom of shaft-support portions 19. For example, in response to carrier 11 being placed (set down) upon a surface 42 as shown in FIGS. 1 and 2, bottom shaft portions 35 are fully inserted into apertures 21, compressing springs 41 and inserting top shaft portions 31 further into cam housings 23 as shown in FIG. 5. As the top shaft portions 31 translate (are inserted) further into cam housing 23, cam follower pins 39 are made to traverse or follow cam slots 37 in an upward and outward direction causing flag portions 33 of stop members 29 to turn outward (away) from recessed region 27, thereby releasing (not binding or blocking) any wafers that may stored in the transport channels 25 of the carrier 11. In response to carrier 11 being picked up or being raised from the surface 42 as shown in FIGS. 3, 4 and 6, springs 41 are released from their compressed state and push down upon flag portions 33 causing bottom shaft portions 35 to extend through and from apertures 21 and causing cam follower pins 39 to move downward and inward within cam slots 37. This, in turn, causes flat portions 33 to turn inward and block items such as wafers that may be stored in the transport channels 25, thereby impeding the wafers from slipping or falling out of the carrier. It is understood that, for mechanical operation clearance purposes, the section of each top shaft portion 31 encircled by corresponding spring 41 when carrier 11 is picked up and the space in each cam housing 23 for receiving the corresponding top shaft portion 31 when the carrier is set down are each at least equal in length to the section of each bottom shaft portion 35 extending from the corresponding aperature 21 when carrier 11 is picked up.

In an alternative embodiment of the present invention, carrier 11 may comprise a third side and one or more stop members disposed as indicated hereinabove, this third side together with sides 13 forming a partial enclosure to prevent wafers from falling out of the carrier in the direction of the third side. In a further embodiment, the stop members may be disposed so as to stop spillage of wafers in opposite directions. For example, carrier 11 may comprise two sides, each having a stop member disposed so that, upon the carrier being picked up, one stop member would act to bind or block the wafers from the front and thereby prevent their spillage in a forward direction and the other stop member would act to bind or block the wafers from the rear and thereby prevent their spillage in a rearward direction.

I claim:

1. A carrier apparatus for impeding spillage of selected items stored therein, the apparatus comprising:
a pair of side plates linked to form a plurality of transport channels, at least one of the side plates having a recessed region; and
a stop member pivotally mounted in the recessed region for automatic movement between an inoperative position out of the transport channels to permit pasage of the items therethrough in response to the apparatus being set down, and an operative position protruding into the transport channels and blocking passage of the items therethrough to impede spillage of the items in response to the apparatus being picked up.

2. A carrier apparatus as in claim 1 wherein the stop member is spring loaded.

3. A carrier apparatus for impeding spillage of selected items stored therein, the apparatus comprising:
a pair of side plates each having a plurality of flanges, at least one of the side plates having a recessed region extending from a top portion thereof and having an aperture extending through the bottom portion thereof in communication with the recessed region, the side plates being affixed to and disposed a selected distance from one another in a manner such that the flanges form a plurality of transport channels for receiving and storing the items;
a cam housing affixed to the top portion of said one of the side plates at a position bridging the recessed region; and
a stop member disposed in the recessed region, one end of the stop member being pivotally and translatably engaged by the cam housing and the other end being inserted through and retractably extending a selected length from the aperture such that, in response to the apparatus being set down, the stop member is activated to permit passage of items along the transport channels and, in response to the apparatus being lifted up, the stop member is activated to automatically block the transport channels and inhibit passage of the items therealong, thereby impeding spillage of the items.

4. A carrier apparatus as in claim 3 including a spring for spring loading the stop member.

5. A carrier apparatus as in claim 4 wherein:
the selected items are semiconductive wafers; and
the stop member includes a top portion, a middle portion, and a bottom portion, the top portion being disposed for supporting the spring thereabout and being disposed partly within the cam housing for pivotal and translational movement therein, the middle portion being disposed for movement into and out of the transport channels, and the bottom portion being disposed for pivotal and translational movement through the aperture.

6. A carrier for impeding spillage of workpieces contained therein, the carrier comprising:
a pair of side plates coupled together and provided with oppositely-facing flanges forming a plurality of transport channels; and
stop means mounted for automatic movement to an inoperative position out of the transport channels to permit passage of the workpieces therealong in response to the carrier being set down and to an operative position protruding into the transport channels to block passage of the workpieces therealong and impede spillage of the workpieces from the carrier in response to the carrier being picked up.

7. A carrier as in claim 6 wherein:
at least one of the side plates includes a recessed region extending partially into the transport channels; and
the stop means comprises a stop member pivotally mounted in the recessed region for automatic movement to the inoperative position in response to the carrier being set down and to the operative position in response to the carrier being picked up.

8. A carrier as in claim 7 wherein:
said one of the side plates includes an opening extending through a bottom portion thereof and communicating with the recessed region thereof;
the carrier includes a cam housing mounted at a top portion of said one of the side plates in communication with the recessed region thereof;
the stop member includes a bottom shaft portion pivotally and translatably disposed in the opening in the bottom portion of said one of the side plates, an enlarged central portion for protruding into the transport channels when the stop member is in the operative position, and a top shaft portion pivotally and translatably disposed in the cam housing and provided with a cam follower engaged by the cam housing; and
the carrier further includes spring-loaded means mounted for automatically moving the stop member to the operative position with the bottom shaft portion protruding through the opening in the bottom portion of said one of said plates in response to the carrier being picked up and for permitting automatic movement of the stop member to the inoperative position with the bottom shaft portion forced up into the opening in the bottom portion of said one of the side plates in response to the carrier being set down.

9. A carrier as in claim 8 wherein the spring-loading means comprises a spring disposed around the top shaft portion of the stop member between the cam housing and the enlarged central portion of the stop member.

10. A carrier as in claim 9 wherein:
the cam housing includes a cam slot extending upward and away from the transport channels; and
the cam follower comprises a cam follower pin engaged with the cam slot for guiding movement of the stop member upward and away from the transport channels to the inoperative position in response to the carrier being set down and for guiding movement of the stop member downward and into the transport channels to the operative position in response to the carrier being picked up.

11. A carrier as in claim 10 wherein:
the workpieces are semiconductive wafers; and
each semiconductive wafer contained in the carrier is supported along oppositely-facing marginal side portions of the semiconductive wafer in a different transport channel by a pair of oppositely-facing flanges forming that transport channel.

12. A carrier as in claim 6 wherein:
the side plates include a plurality of recessed regions each extending partially into the transport channels; and
the stop means comprises a plurality of stop members each pivotally mounted in an associated different one of the recessed regions for automatic movement to the inoperative position in response to the carrier being set down and to the operative position in response to the carrier being picked up.

13. A carrier as in claim 12 wherein:
the side plates include a plurality of openings each extending through a bottom portion of one of the side plates and communicating with an associated different one of the recessed regions;
the carrier includes a plurality of cam housings each mounted at a top portion of one of the side plates in communication with an associated different one of the recessed regions;
each stop member includes a bottom shaft portion associated with and pivotally and translatably disposed in the opening communicating with the associated recessed region, an enlarged central portion for protruding into the transport channels when the stop member is in the operative position, and a top shaft portion pivotally and translatably disposed in and provided with a cam follower associated with and engaged by the cam housing communicating with the associated recessed region; and
the carrier further includes spring-loading means mounted for automatically moving the stop members to the operative position with the bottom shaft portions protruding through the associated openings in response to the carrier being picked up and for permitting automatic movement of the stop members to the inoperative position with the bottom shaft portions forced up into the associated openings in response to the carrier being set down.

14. A carrier as in claim 13 wherein the spring-loading means comprises a plurality of springs each disposed around the top shaft portion of an associated different one of the stop members between the associated cam housing and the enlarged central portion of that stop member.

15. A carrier as in claim 14 wherein:
each cam housing includes a cam slot extending upward and away from the transport channels; and
each cam follower comprises a cam follower pin engaged with the cam slot of the associated cam housing for guiding movement of the associated stop member upward and away from the transport channels to the inoperative position in response to the carrier being set down and for guiding movement of the associated stop member downward and into the transport channels to the operative position in response to the carrier being picked up.

16. A carrier as in claim 15 wherein:
the workpieces are semiconductive wafers; and
each semiconductive wafer contained in the carrier is supported along oppositely-facing marginal side portions of the semiconductive wafer in a different transport channel by a pair of oppositely-facing flanges forming that transport channel.

17. A carrier as in claim 6 wherein:
the side plates include a pair of recessed regions extending partially into the transport channels, each recessed region being formed in an associated different one of the side plates;
each of the side plates further includes an opening extending through a bottom portion thereof and communicating with the associated recessed region;
the stop means comprises a pair of stop members each pivotally mounted in an associated different one of the recessed regions for automatic movement to the inoperative position in response to the carrier being set down and to the operative position in response to the carrier being picked up;

the carrier includes a pair of cam housings each mounted at a top portion of an associated different one of the side plates in communication with an associated different one of the recessed regions;

each of the stop members includes a bottom shaft portion associated with and pivotally and translatably disposed in the opening communicating with the associated recessed region, an enlarged central portion for protruding into the transport channels when the stop member is in the operative position, and a top shaft portion pivotally and translatably disposed in and provided with a cam follower associated with and engaged by the cam housing communicating with the associated recessed region; and the carrier further includes a pair of springs each disposed around the top shaft portion of an associated different one of the stop members between the associated cam housing and the enlarged central portion of that stop member.

18. A carrier as in claim 17 wherein:

each cam housing includes a cam slot extending upward and away from the transport channels; and each cam follower comprises a cam follower pin engaged with the cam slot of the associated cam housing for guiding movement of the associated stop member upward and away from the transport channels to the inoperative position in response to the carrier being set down and for guiding movement of the associated stop member downward and into the transport channels to the operative position in response to the carrier being picked up.

19. A carrier as in claim 18 wherein:

the recessed regions are formed in the side plates directly across from one another in oppositely-facing relationship; and the stop members are pivotally and translatably mounted in the associated recessed regions directly across from one another in oppositely-facing relationship.

20. A carrier as in claim 19 wherein:

the workpieces are semiconductive wafers; and each semiconductive wafer contained in the carrier is supported along oppositely-facing marginal side portions of the semiconductive wafer in a different transport channel by a pair of oppositely-facing flanges forming that transport channel.

* * * * *

UNITED STATES PATENT AND TRADEMARK OFFICE
CERTIFICATE OF CORRECTION

PATENT NO. : 4,228,902
DATED : October 21, 1980
INVENTOR(S) : Harvey L. Schulte

It is certified that error appears in the above-identified patent and that said Letters Patent are hereby corrected as shown below:

Column 2, line 7, immediately after "fixedly-spaced" insert a comma;

Column 2, line 18, immediately after "picked-up," insert "each";

Column 2, line 23, delete the comma;

Column 2, line 24, immediately after "when" insert "the";

Column 2, line 47, immediately after "region" insert "17";

Column 2, line 48, delete "17";

Column 2, line 51, immediately after "of" insert "the";

Column 3, line 9, cancel "28" and substitute "29";

Column 3, line 26, cancel "region 27" and substitute "regions 17'

Column 3, line 36, cancel "flat" and substitute "flag";

Column 3, line 41, immediately after "by" insert "the";

Column 3, line 47, cancel "aperature" and substitute "aperture";

Column 4, line 19, immediately after "portion" insert "to a bottom portion"; and Column 5, line 30, cancel "said" (second occurrence) and substitute "the side".

Signed and Sealed this

Sixteenth Day of June 1981

[SEAL]

Attest:

RENE D. TEGTMEYER

Attesting Officer     Acting Commissioner of Patents and Trademarks